US008175142B2

(12) United States Patent
Atungsiri et al.

(10) Patent No.: US 8,175,142 B2
(45) Date of Patent: May 8, 2012

(54) ODD-EVEN INTERLEAVING WHILE CHANGING THE OPERATING MODE IN A DIGITAL VIDEO BROADCASTING (DVB) STANDARD

(75) Inventors: Samuel Asanbeng Atungsiri, Basingstoke (GB); Matthew Paul Athol Taylor, Ringwood (GB)

(73) Assignee: Sony Corporation, Tokyo (JP)

( * ) Notice: Subject to any disclaimer, the term of this patent is extended or adjusted under 35 U.S.C. 154(b) by 245 days.

(21) Appl. No.: 12/435,657

(22) Filed: May 5, 2009

(65) Prior Publication Data

US 2009/0296838 A1 Dec. 3, 2009

(30) Foreign Application Priority Data

May 30, 2008 (GB) .................. 0809910.3

(51) Int. Cl.
 *H03H 7/30* (2006.01)
(52) U.S. Cl. ....................... 375/230
(58) Field of Classification Search ........... 375/230
See application file for complete search history.

(56) References Cited

U.S. PATENT DOCUMENTS

| | | | |
|---|---|---|---|
| 5,799,033 A | 8/1998 | Baggen | |
| 6,314,534 B1 * | 11/2001 | Agrawal et al. | 714/702 |
| 6,625,234 B1 * | 9/2003 | Cui et al. | 375/341 |
| 7,426,240 B2 | 9/2008 | Peron | |
| 7,543,197 B2 * | 6/2009 | Palanki et al. | 714/701 |
| 2002/0186797 A1 * | 12/2002 | Robinson | 375/341 |
| 2004/0246888 A1 * | 12/2004 | Peron | 370/208 |
| 2005/0008084 A1 * | 1/2005 | Zhidkov | 375/260 |
| 2005/0135493 A1 | 6/2005 | Maltsev et al. | |
| 2006/0062314 A1 * | 3/2006 | Palin et al. | 375/260 |
| 2006/0123323 A1 * | 6/2006 | Kim et al. | 714/763 |
| 2007/0250742 A1 | 10/2007 | Kowalski | |
| 2009/0110091 A1 | 4/2009 | Taylor et al. | |
| 2009/0110092 A1 | 4/2009 | Taylor et al. | |

(Continued)

FOREIGN PATENT DOCUMENTS

EP 1 463 256 A1 9/2004

OTHER PUBLICATIONS

Afshari, "A Novel Symbol Interleaver Address Generation Architecture for DVB-T Modulator" International Symposium on Communications and Information Technologies, 2006, ISCIT '06, Publication Year: 2006, pp. 989-993.*
U.S. Appl. No. 12/782,991, filed May 19, 2010, Atungsiri.
"Digital Video Broadcasting (DVB); Framing structure, channel coding and modulation for digital terrestrial television", ETSI, EN 300 744 V1.1.2, Aug. 1997, 47 pages.

(Continued)

*Primary Examiner* — Juan A Torres
(74) *Attorney, Agent, or Firm* — Oblon, Spivak, McClelland, Maier & Neustadt, L.L.P.

(57) ABSTRACT

A data processing apparatus to map input data symbols to be communicated onto a predetermined number of sub-carrier signals of Orthogonal Frequency Division Multiplexed OFDM symbols. The predetermined number of sub-carrier signals is determined in accordance with one of a plurality of operating modes and the input data symbols include first sets of data symbols and second sets of input data symbols. The data processing apparatus includes a controller, an address generator, and an interleaver memory. The controller is configured, when operating in accordance with an even interleaving process, to read out a first set of the input data symbols from the interleaver memory on to the sub-carrier signals of an even OFDM symbol using read addresses generated by the address generator, and to write in a second set of the input data symbols into the interleaver memory using the addresses generated by the address generator.

7 Claims, 9 Drawing Sheets

U.S. PATENT DOCUMENTS

| | | |
|---|---|---|
| 2009/0110093 A1 | 4/2009 | Taylor et al. |
| 2009/0110094 A1 | 4/2009 | Taylor et al. |
| 2009/0110095 A1 | 4/2009 | Taylor et al. |
| 2009/0110097 A1 | 4/2009 | Taylor et al. |
| 2009/0110098 A1 | 4/2009 | Taylor et al. |
| 2009/0125780 A1 | 5/2009 | Taylor et al. |
| 2009/0300300 A1* | 12/2009 | Treigherman ............... 711/157 |

OTHER PUBLICATIONS

Digital Video Broadcasting (DVB); Frame structure channel coding and modulation for a second generation digital terrestrial television broadcasting system (DVB-T2), ETSI, Draft ETSI EN 302 755 V1.1.1, Apr. 2008, 162 pages.

U.S. Appl. No. 12/437,207, filed May 7, 2009, Atungsiri, et al.

* cited by examiner

ODD-EVEN INTERLEAVING WHILE CHANGING THE OPERATING MODE IN A DIGITAL VIDEO BROADCASTING (DVB) STANDARD

FIELD OF INVENTION

The present invention relates to data processing apparatus operable to map input symbols onto sub-carrier signals of Orthogonal Frequency Division Multiplexed (OFDM) symbols.

The present invention also relates to data processing apparatus operable to map symbols received from a predetermined number of sub-carrier signals of an OFDM symbol into an output symbol stream.

Embodiments of the present invention can provide an OFDM transmitter/receiver.

BACKGROUND OF THE INVENTION

The Digital Video Broadcasting-Terrestrial standard (DVB-T) utilises Orthogonal Frequency Division Multiplexing (OFDM) to communicate data representing video images and sound to receivers via a broadcast radio communications signal. There are known to be two modes for the DVB-T standard which are known as the 2 k and the 8 k mode. The 2 k mode provides 2048 sub-carriers whereas the 8 k mode provides 8192 sub-carriers. Similarly for the Digital Video Broadcasting-Handheld standard (DVB-H) a 4 k mode has been provided, in which the number of sub-carriers is 4096.

In order to improve the integrity of data communicated using DVB-T or DVB-H a symbol interleaver is provided in order to interleave input data symbols as these symbols are mapped onto the sub-carrier signals of an OFDM symbol. Such a symbol interleaver comprises an interleaver memory in combination with an address generator. The address generator generates an address for each of the input symbols, each address indicating one of the sub-carrier signals of the OFDM symbol onto which the data symbol is to be mapped. For the 2 k mode and the 8 k mode an arrangement has been disclosed in the DVB-T standard for generating the addresses for the mapping. Likewise for the 4 k mode of DVB-H standard, an arrangement for generating addresses for the mapping has been provided and an address generator for implementing this mapping is disclosed in European Patent application 04251667.4. The address generator comprises a linear feed back shift register which is operable to generate a pseudo random bit sequence and a permutation circuit. The permutation circuit permutes the order of the content of the linear feed back shift register in order to generate an address. The address provides an indication of one of the OFDM sub-carriers for carrying an input data symbol stored in the interleaver memory, in order to map the input symbols onto the sub-carrier signals of the OFDM symbol.

In accordance with a further development of the Digital Video Broadcasting-Terrestrial broadcasting standard, known as DVB-T2 there has been proposed that further modes for communicating data be provided.

SUMMARY OF THE INVENTION

According to an aspect of the present invention there is provided a data processing apparatus operable to map input data symbols to be communicated onto a predetermined number of sub-carrier signals of Orthogonal Frequency Division Multiplexed OFDM symbols, the predetermined number of sub-carrier signals being determined in accordance with one of a plurality of operating modes and the input data symbols including first sets of data symbols and second sets of input data symbols. The data processing apparatus comprises a controller, an address generator and an interleaver memory, the controller being operable, when operating in accordance with an even interleaving process to read out a first set of the input data symbols from the interleaver memory on to the sub-carrier signals of an even OFDM symbol using read addresses generated by the address generator, and to write in a second set of the input data symbols into the interleaver memory using the addresses generated by the address generator. The controller is operable in accordance with an odd interleaving process, to read out a first set of input data symbols from the interleaver memory on to the sub-carrier signals of an odd OFDM symbol using read addresses determined in accordance with a sequential order of the first set of input data symbols, and to write in a second set of the input data symbols into the interleaver memory at write addresses determined in accordance with the sequential order of the first group of input data symbols, such that while input data symbols from the first set are being read from locations in the interleaver memory, input data symbols from the second set can be written to the locations just read from. The number of the sub-carriers which are available from a current OFDM symbol is different from the number of the sub-carriers which are available from a previous OFDM symbol, and the controller is operable to determine before reading out the first input data symbols from the interleaver memory, whether the read address is valid for the previous OFDM symbol, and to determine before writing the second input data symbols into the interleaver memory, whether the write address is valid for the current OFDM symbol.

In multi-carrier modulation systems such as OFDM as used for DVB-T/H [1] and DVB-T2 [2], frequency or symbol interleavers are used to provide frequency diversity especially in frequency selective channels. In both systems, the frequency interleaver works differently for odd and even OFDM symbols. As will be explained shortly, to minimise the amount of memory used for interleaving, the odd and even symbol interleavers operate in a complimentary manner, so that the amount of memory can be minimised. DVB-T/H has only one type of OFDM symbol whilst DVB-T2 has at least three types of OFDM symbol, as a result, whilst in DVB-T/H the length of the vector of data sub-carriers into the interleaver is fixed, in DVB-T2 the input vector length varies according to the type of OFDM symbol.

Embodiments of the present invention provide an arrangement in which a frequency0 interleaver can be implemented to cope with a change in a number of sub-carriers for carrying input data symbols between successive OFMD symbols, whilst minimising an amount of interleaver memory required. The frequency interleaver can be used in different operating modes, which may be required to communicate in any one of a plurality of operating modes. For example, the operating modes according to the DVB-T2 standard include 1 k, 2 k, 4 k, 8 k, 16 k and 32 k modes. By determining before reading out the first input data symbols from the interleaver memory, whether the read address is valid for a previous OFDM symbol, and determining before writing the second input data symbols into the interleaver memory, whether the write address is valid for a current OFDM symbol, the interleaver memory size can be minimised to an amount which corresponds to a maximum number of sub-carriers, which are available for an OFDM symbol for any of the operating modes. The mode with the maximum number of sub-carriers may correspond to an operation of the interleaver to interleave input data symbols in accordance with odd and even OFDM symbols. Therefore, for example, the memory size of the interleaver memory can be made equal to the number of symbols which can be carried by the sub-carriers of the OFDM symbols in the mode which has the largest number of sub-carriers. For the example of DVB-T2 this is the 32 k mode.

Various aspects and features of the present invention are defined in the appended claims. Further aspects of the present invention include a data processing apparatus operable to map symbols received from a predetermined number of sub-carrier signals of an Orthogonal Frequency Division Multiplexed (OFDM) symbol into an output symbol stream, as well as a transmitter and a receiver.

BRIEF DESCRIPTION OF DRAWINGS

Embodiments of the present invention will now be described by way of example only with reference to the accompanying drawings, wherein like parts are provided with corresponding reference numerals, and in which.

DESCRIPTION OF PREFERRED EMBODIMENTS

The following description is provided to illustrate the operation of a symbol interleaver in accordance with the present technique, although it will be appreciated that the symbol interleaver can be used with other modes and other DVB standards.

Figure 1:
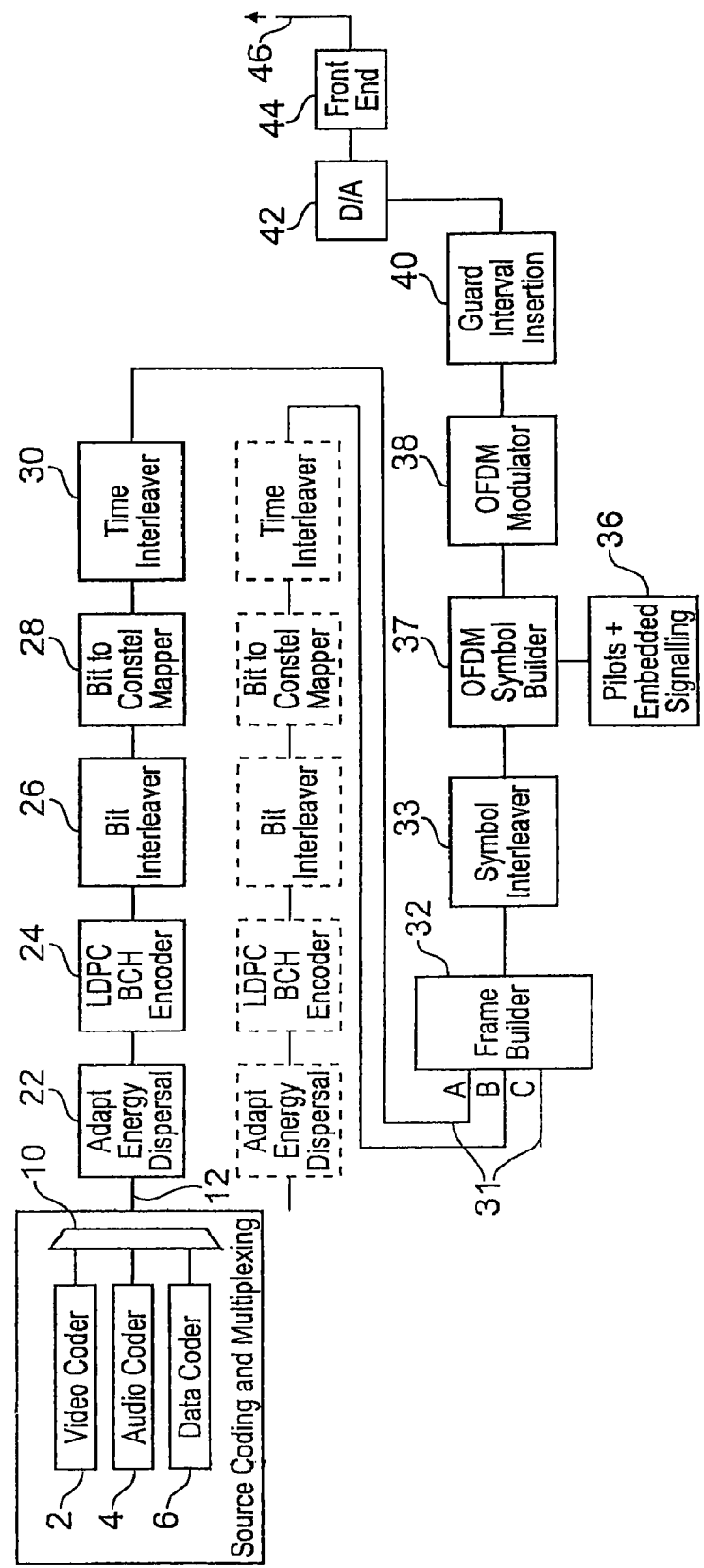
FIG. 1 is a schematic block diagram of a Coded OFDM transmitter which may be used, for example, with the DVB-T2 standard.

FIG. 1 provides an example block diagram of a Coded OFDM transmitter which may be used for example to transmit video images and audio signals in accordance with the DVB-T2 standard. In FIG. 1 a program source generates data to be transmitted by the Coded Orthogonal Frequency Division Multiplexing (COFDM) transmitter. A video coder 2, and audio coder 4 and a data coder 6 generate video, audio and other data to be transmitted which are fed to a program multiplexer 10. The output of the program multiplexer 10 forms a multiplexed stream with other information required to communicate the video, audio and other data. The multiplexer 10 provides a stream on a connecting channel 12. There may be many such multiplexed streams which are fed into different branches A, B etc. For simplicity, only branch A will be described.

As shown in FIG. 1 a COFDM transmitter receives the stream at a multiplexer adaptation and energy dispersal block 22. The multiplexer adaptation and energy dispersal block 22 randomises the data and feeds the appropriate data to a forward error correction encoder 24 which performs error correction encoding of the stream. A bit interleaver 26 is provided to interleave the encoded data bits which for the example of DVB-T2 is the Low-Density Parity Check/Bose-Chaudhuri-Hocquengham (LDPC/BCH) encoder output. The output from the bit interleaver 26 is fed to a bit into constellation mapper 28, which maps groups of bits onto a constellation point, which is to be used for conveying the encoded data bits. The outputs from the bit into constellation mapper 28 are constellation point labels that represent real and imaginary components. The constellation point labels represent data symbols formed from two or more bits depending on the modulation scheme used. These will be referred to as data cells. These data cells are passed through a time-interleaver 30 whose effect is to interleaver data cells resulting from multiple LDPC code words.

The data cells are received by a frame builder 32, with data cells produced by branch B etc in FIG. 1, via other channels 31. The frame builder 32 then forms many data cells into sequences to be conveyed on COFDM symbols, where a COFDM symbol comprises a number of data cells, each data cell being mapped onto one of the sub-carriers. The number of sub-carriers will depend on the mode of operation of the system, which may include one of 1 k, 2 k, 4 k, 8 k, 16 k or 32 k, each of which provides a different number of sub-carriers according, for example to the following table:

| Number of Sub-carriers Adapted from DVB-T/H | | |
|---|---|---|
| Mode | Max Number of Addresses $N_u$ | Sub-carriers $N_m$ |
| 1k | 1024 | 756 |
| 2k | 2048 | 1512 |
| 4k | 4096 | 3048 |
| 8k | 8192 | 6096 |
| 16k | 16384 | 12096 |
| 32k | 32768 | 24192 |

Thus in one example, the number of sub-carriers for the 16 k mode is twelve thousand and ninety six, and for the 32 k mode the number of sub-carriers is twenty four thousand one hundred and ninety two.

Each frame comprises many such COFDM symbols. The sequence of data cells to be carried in each COFDM symbol is then passed to the symbol interleaver 33. The COFDM symbol is then generated by a COFDM symbol builder block 37 which uses the constellation data labels to generate the real and imaginary parts of the constellation points and also introducing pilot and synchronising signals fed from a pilot and embedded signal former 36. An OFDM modulator 38 then forms the OFDM symbol in the time domain which is fed to a guard insertion processor 40 for generating a guard interval between symbols, and then to a digital to analogue convertor 42 and finally to an RF amplifier within an RF front 44 for eventual broadcast by the COFDM transmitter from an antenna 46.

Interleaver

Figure 2:
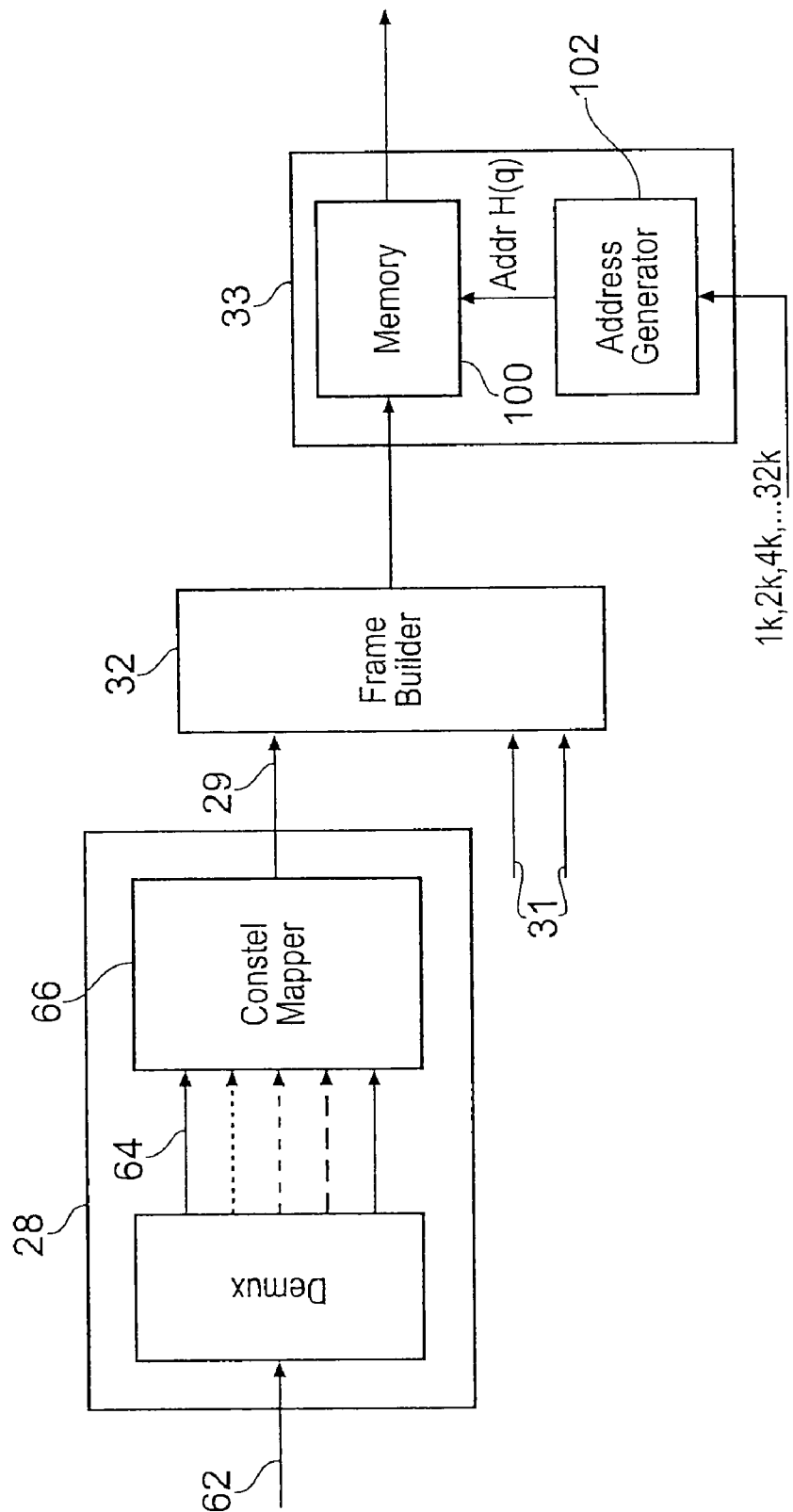
FIG. 2 is a schematic block diagram of parts of the transmitter shown in FIG. 1 in which a symbol mapper and a frame builder illustrate the operation of an interleaver.

The bit to constellation mapper 28, symbol interleaver 33 and the frame builder 32 are shown in more detail in FIG. 2.

The symbol interleaver provides a quasi-optimal mapping of the data symbols onto the OFDM sub-carrier signals. According to the example technique the symbol interleaver is provided to effect the optimal mapping of input data symbols onto COFDM sub-carrier signals in accordance with a permutation code and generator polynomial, which has been verified by simulation analysis.

As shown in FIG. 2 a more detailed example illustration of the bit to symbol constellation mapper 28 and the frame builder 32 is provided to illustrate an example embodiment of the present technique. Data bits received from the bit interleaver 26 via a channel 62 are grouped into sets of bits to be mapped onto a data cell, in accordance with a number of bits per symbol provided by the modulation scheme. The groups of bits, which forms a data word, are fed in parallel via data channels 64 the a mapping processor 66. The mapping processor 66 then selects one of the data symbols, in accordance with a pre-assigned mapping. The constellation point, is represented by a real and an imaginary component but only its label is provided to the output channel 29 as one of a set of inputs to the frame builder 32.

The frame builder 32 receives the data cells from the bit to constellation mapper 28 through channel 29, together with data cells from the other channels 31. After building a frame of many COFDM cell sequences, the cells of each COFDM symbol are then written into an interleaver memory 100 and read out of the interleaver memory 100 in accordance with write addresses and read addresses generated by an address generator 102. According to the write-in and read-out order, interleaving of the data cells is achieved, by generating appropriate addresses. The operation of the address generator 102 and the interleaver memory 100 will be described in more detail shortly with reference to FIGS. 3, 4, 5 and 6. The interleaved data cells are then mapped to real and imaginary components of data symbols, which are combined with pilot and synchronisation symbols received from the pilot and embedded signalling former 36 into an OFDM symbol builder 37, to form the COFDM symbol, which is fed to the OFDM modulator 38 as explained above.

Figure 3:
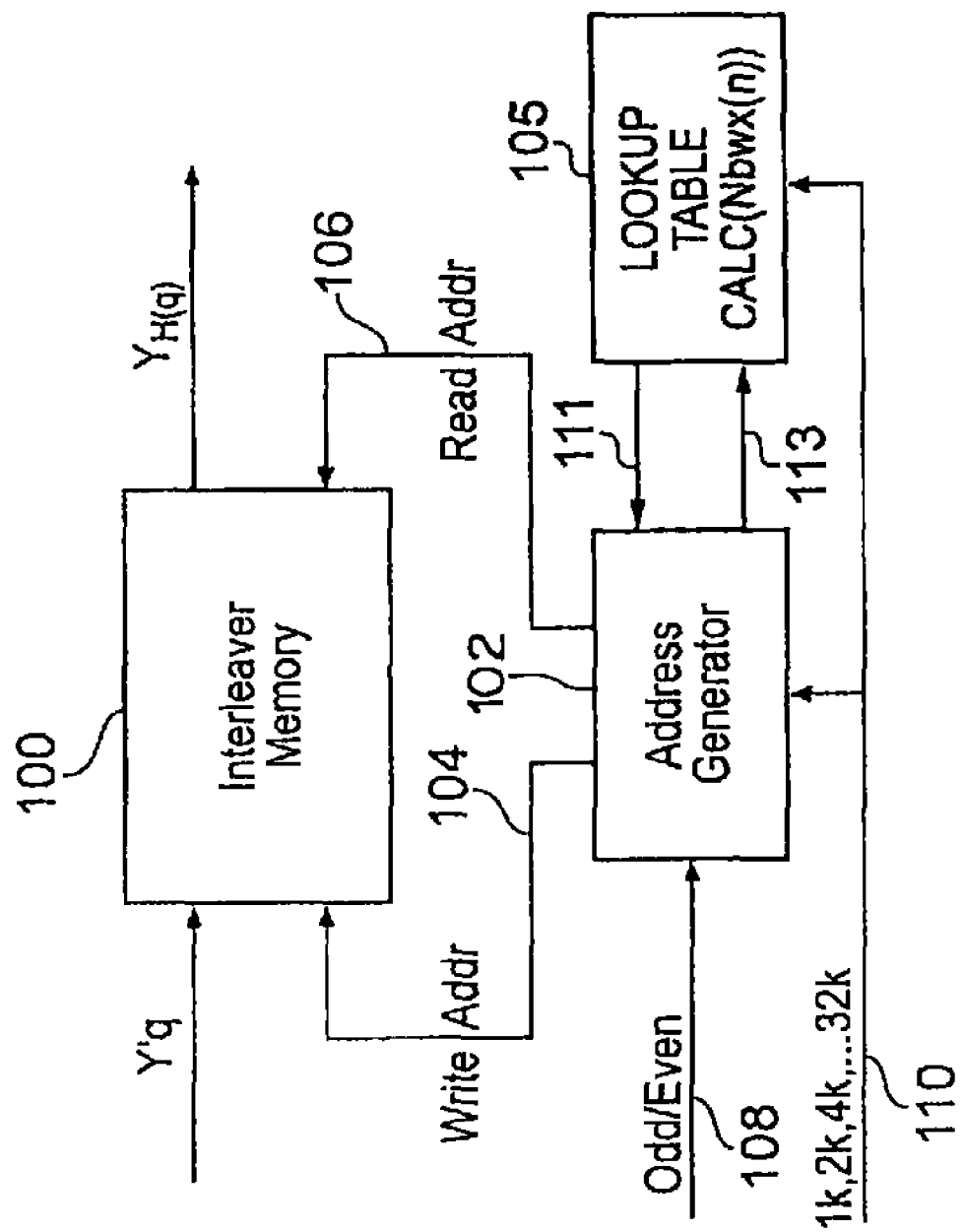
FIG. 3 is a schematic block diagram of the symbol interleaver shown in FIG. 2.

FIG. 3 provides an example of parts of the symbol interleaver 33, which illustrates the present technique for interleaving symbols. In FIG. 3 the input data cells from the frame builder 32 are written into the interleaver memory 100. The data cells are written into the interleaver memory 100 according to a write address fed from the address generator 102 on channel 104, and read out from the interleaver memory 100 according to a read address fed from the address generator 102 on a channel 106. The address generator 102 generates the write address and the read address as explained below, depending on whether the COFDM symbol is odd or even, which is identified from a signal fed from a channel 108, and depending on a selected mode, which is identified from a signal fed from a channel 110. As explained, the mode can be one of a 1 k mode, 2 k mode, 4 k mode, 8 k mode, 16 k mode or a 32 k mode. As explained below, the write address and the read address are generated differently for odd and even symbols as explained with reference to FIG. 4, which provides an example implementation of the interleaver memory 100.

Figure 4:
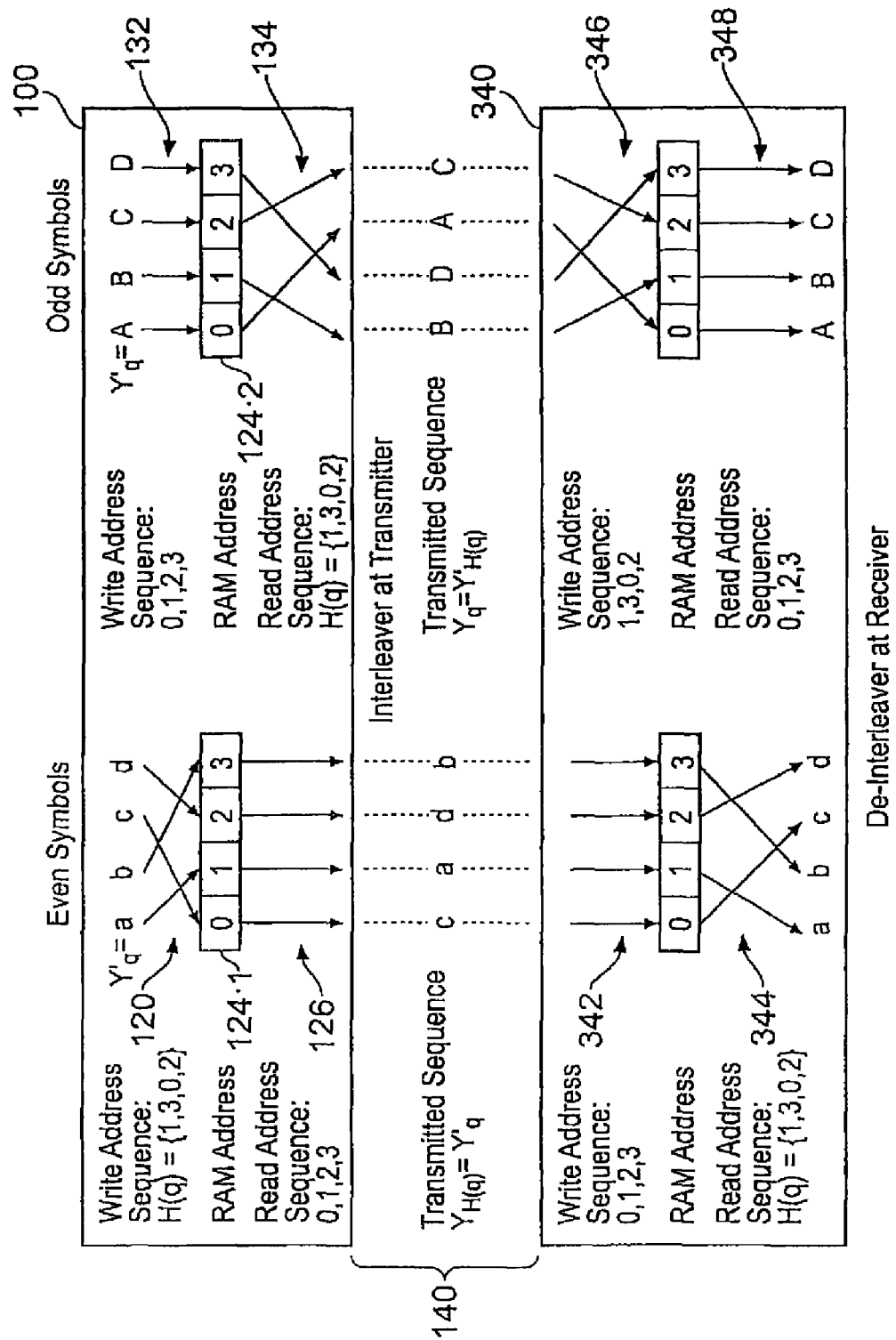
FIG. 4 is a schematic block diagram of an interleaver memory shown in FIG. 3 and the corresponding symbol de-interleaver in the receiver.

In the example shown in FIG. 4, the interleaver memory is shown to comprise an upper part 100 illustrating the operation of the interleaver memory in the transmitter and a lower part 340, which illustrates the operation of the de-interleaver memory in the receiver. The interleaver 100 and the de-interleaver 340 are shown together in FIG. 4 in order to facilitate understanding of their operation. As shown in FIG. 4 a representation of the communication between the interleaver 100 and the de-interleaver 340 via other devices and via a transmission channel has been simplified and represented as a section 140 between the interleaver 100 and the de-interleaver 340. The operation of the interleaver 100 is described in the following paragraphs:

Although FIG. 4 provides an illustration of only four input data cells onto an example of four sub-carrier signals of a COFDM symbol, it will be appreciated that the technique illustrated in FIG. 4 can be extended to a larger number of sub-carriers such as 756 for the 1 k mode 1512 for the 2 k mode, 3024 for the 4 k mode and 6048 for the 8 k mode, 12096 for the 16 k mode and 24192 for the 32 k mode.

The input and output addressing of the interleaver memory 100 shown in FIG. 4 is shown for odd and even symbols. For an even COFDM symbol the data cells are taken from the input channel and written into the interleaver memory 124.1 in accordance with a sequence of addresses 120 generated for each COFDM symbol by the address generator 102. The write addresses are applied for the even symbol so that as illustrated interleaving is effected by the shuffling of the write-in addresses. Therefore, for each interleaved symbol $y(h(q))=y'(q)$.

For odd symbols the same interleaver memory 124.2 is used. However, as shown in FIG. 4 for the odd symbol the write-in order 132 is in the same address sequence used to read out the previous even symbol 126. This feature allows the odd and even symbol interleaver implementations to only use one interleaver memory 100 provided the read-out operation for a given address is performed before the write-in operation. The data cells written into the interleaver memory 124.2 during odd symbols are then read out in a sequence 134 generated by the address generator 102 for the next even COFDM symbol and so on. Thus only one address is generated per symbol, with the read-in and write-out for the odd/even COFDM symbol being performed contemporaneously.

In summary, as represented in FIG. 4, once the set of addresses H(q) has been calculated for all active sub-carriers, the input vector $Y'=(y'_0, y'_1, y'_2, \ldots y'_{Nmax-1})$ is processed to produce the interleaved vector $Y=(y_0, y_1, y_2, \ldots y_{Nmax-1})$ defined by:

$$y_{H(q)} = y'_q \text{ for even symbols for } q=0, \ldots, N_{max}-1$$

$$y_q = y'_{H(q)} \text{ for odd symbols for } q=0, \ldots, N_{max}-1$$

In other words, for even OFDM symbols the input words are written in a permutated way into a memory and read back in a sequential way, whereas for odd symbols, they are written sequentially and read back permutated. In the above case, the permutation H(q) is defined by the following table:

TABLE 1 permutation for simple case where Nmax = 4

| | q | | | |
|---|---|---|---|---|
| | 0 | 1 | 2 | 3 |
| H(q) | 1 | 3 | 0 | 2 |

As shown in FIG. 4, the de-interleaver 340 operates to reverse the interleaving applied by the interleaver 100, by applying the same set of addresses as generated by an equivalent address generator, but applying the write-in and read-out addresses in reverse. As such, for even symbols, the write-in addresses 342 are in sequential order, whereas the read out address 344 are provided by the address generator. Correspondingly, for the odd symbols, the write-in order 346 is determined from the set of addresses generated by the address generator, whereas read out 348 is in sequential order.

Address Generation for the 16 k and 32K Modes

Figure 5:
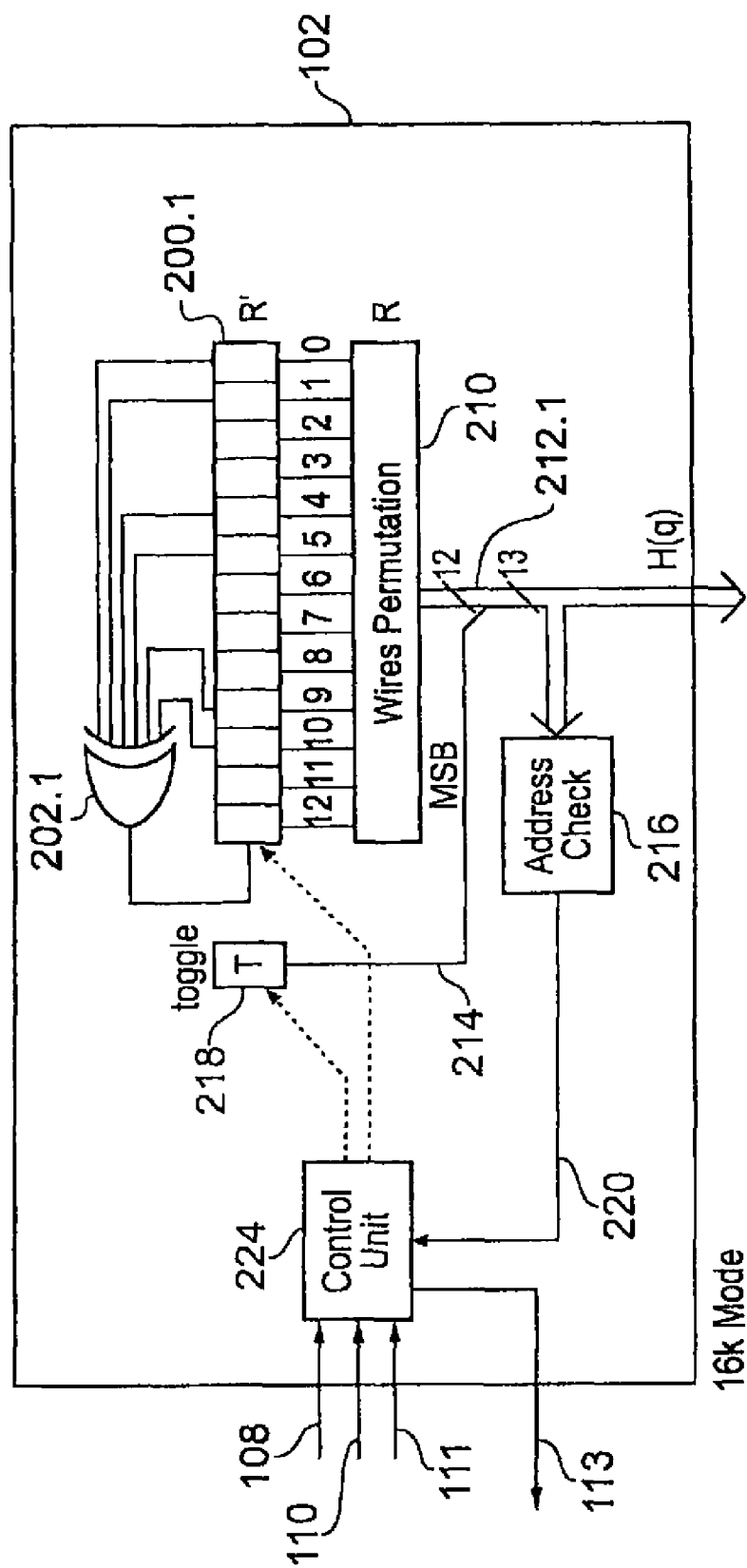
FIG. 5 is a schematic block diagram of an address generator shown in FIG. 3 for the 16 k mode.
Figure 6:
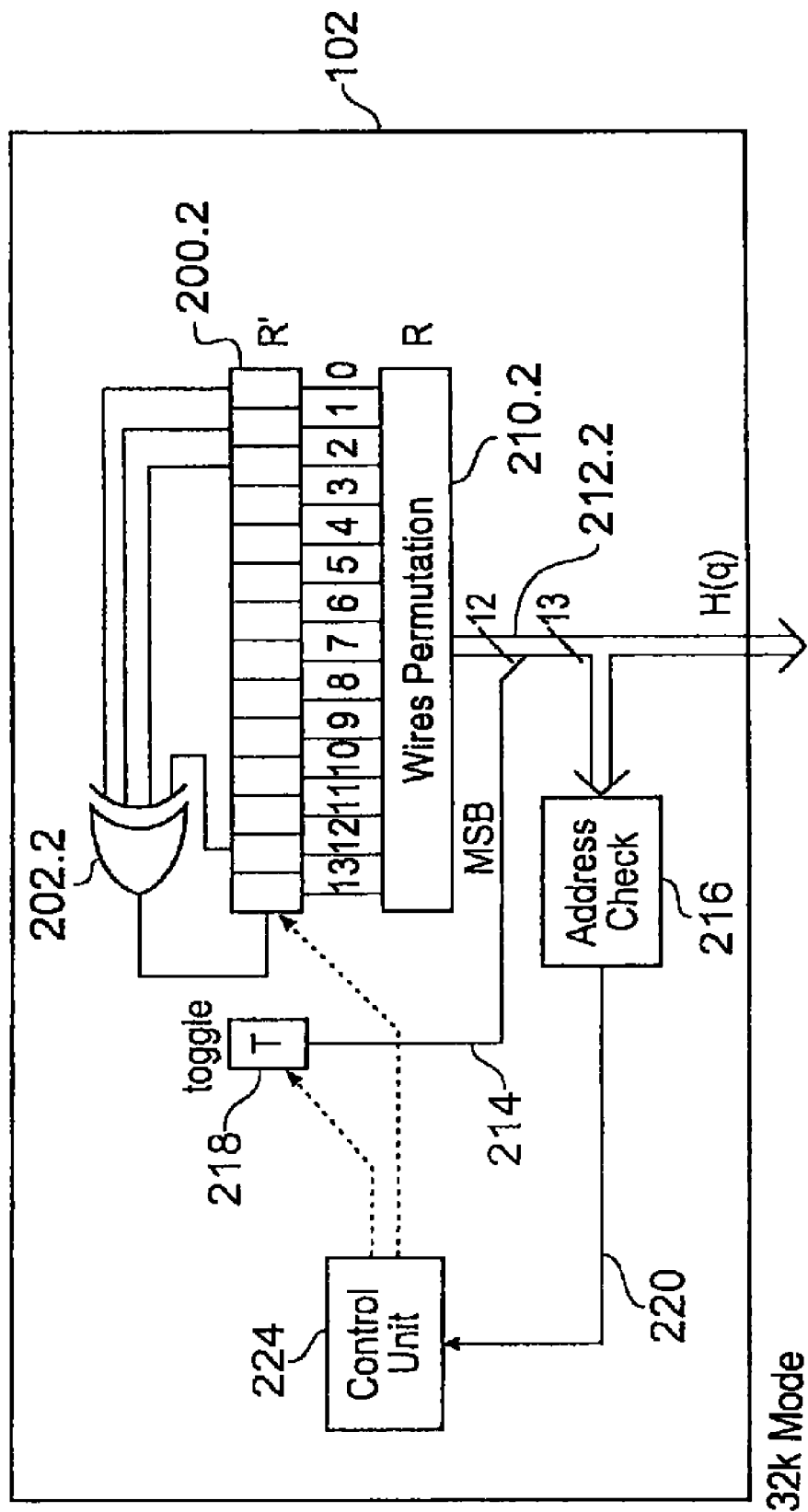
FIG. 6 is a schematic block diagram of an address generator shown in FIG. 3 for the 32 k mode.

A schematic block diagram of the algorithm used to generate the permutation function H(q) is represented in FIG. 5 for the 16 k mode and FIG. 6 for the 32 k mode.

An implementation of the address generator 102 for the 16 k mode is shown in FIG. 5. In FIG. 5 a linear feed back shift register is formed by thirteen register stages 200.1 and an xor-gate 202.1, which is connected to the stages of the shift register 200.1 in accordance with a generator polynomial. Therefore, in accordance with the content of the shift register 200.1 a next bit of the shift register is provided from the output of the xor-gate 202.1 by xoring the content of shift registers R[0], R[1], R[4], R[5], R[9], R[11] according to the generator polynomial:

$$R'_i[12]=R'_{i-1}[0] \oplus R'_{i-1}[1] \oplus R'_{i-1}[4] \oplus R'_{i-1}[5] \oplus R'_{i-1}[9] R'_{i-1}[11]$$

According to the generator polynomial a pseudo random bit sequence is generated from the content of the shift register 200.1. However, in order to generate an address for the 16 k mode as illustrated, a permutation circuit 210 is provided which effectively permutes the order of the bits within the shift register 200.1 from an order $R'_i[n]$ to an order $R_i[n]$ at the output of the permutation circuit 210. Thirteen bits from the output of the permutation circuit 210 are then fed on a connecting channel 212.1 to which is added a most significant bit via a channel 214 which is provided by a toggle circuit 218. A fourteen bit address is therefore generated on channel 212.1. However, in order to ensure the authenticity of an address, an address check circuit 216 analyses the generated address to determine whether it exceeds a predetermined maximum value. The predetermined maximum value may correspond to the maximum number of sub-carrier signals, which are available for data symbols within the COFDM symbol, available for the mode which is being used. However, the interleaver for the 16 k mode may also be used for other modes, so that the address generator 102 may also be used for the 2 k mode, 4 k mode, 8 k mode, 16 k mode and the 32 k mode, by adjusting accordingly the number of the maximum valid address.

If the generated address exceeds the predetermined maximum value then a control signal is generated by the address check unit 216 and fed via a connecting channel 220 to a control unit 224. If the generated address exceeds the predetermined maximum value then this address is rejected and a new address regenerated for the particular symbol.

For the 16 k mode, an ($N_r$-1) bit word $R'_i$ is defined, with $N_r=\log_2 M_{max}$, where $M_{max}=16384$ using a LFSR (Linear Feedback Shift Register).

The polynomials used to generate this sequence is:

16 k mode: $R'_i[12]=R'_{i-1}[0] \oplus R'_{i-1}[1] \oplus R'_{i-1}[4] \oplus R'_{i-1}[5] \oplus R'_{i-1}[9] R'_{i-1}[11]$ where i varies from 0 to $M_{max}-1$ Once one $R'_i$ word has been generated, the $R'_i$ word goes through a permutation to produce another ($N_r$-1) bit word called $R_i$. $R_i$ is derived from $R'_i$ by the bit permutations given as follows:

| $R'_i$ bit positions | 12 | 11 | 10 | 9 | 8 | 7 | 6 | 5 | 4 | 3 | 2 | 1 | 0 |
|---|---|---|---|---|---|---|---|---|---|---|---|---|---|
| $R_i$ bit positions | 8 | 4 | 3 | 2 | 0 | 11 | 1 | 5 | 12 | 10 | 6 | 7 | 9 |

Bit permutation for the 16 k mode

As an example, this means that for the mode 16 k, the bit number 12 of $R'_i$ is sent in bit position number 8 of $R_i$.

The address H(q) is then derived from $R_i$ through the following equation:

$$H(q) = (i \bmod 2) \cdot 2^{N_r-1} + \sum_{j=0}^{N_r-2} R_i(j) \cdot 2^j$$

The $(i \bmod 2) \cdot 2^{N_r-1}$ part of the above equation is represented in FIG. 5 by the toggle block T 218.

An address check is then performed on H(q) to verify that the generated address is within the range of acceptable addresses: if $(H(q)<N_{max})$, where $N_{max}=12096$ for example in the 16 k mode, then the address is valid. If the address is not valid, the control unit is informed and it will try to generate a new H(q) by incrementing the index i.

The role of the toggle block is to make sure that we do not generate an address exceeding $N_{max}$ twice in a row. In effect, if an exceeding value was generated, this means that the MSB (i.e. the toggle bit) of the address H(q) was one. So the next value generated will have a MSB set to zero, insuring to produce a valid address.

The following equations sum up the overall behaviour and help to understand the loop structure of this algorithm:

q=0;

for (i=0; i<$M_{max}$; i=i+1)

$$\left\{ H(q) = (i \bmod 2) \cdot 2^{N_r-1} + \sum_{j=0}^{N_r-2} R_i(j) \cdot 2^j; \text{ if } (H(q) < N_{max}) q = q + 1; \right\}$$

Also shown in FIG. 3 is a lookup table 105 which receives an indication of the current operating, mode on a control channel 110. As shown in FIGS. 5 and 6 the control unit 224 receives from control channel 108 an indication of the current symbol (odd/even), and from the control channel 110 an indication of the current mode, and from a control channel 111 an indication from the lookup table of the current number of sub-carriers or data cells in the OFDM symbol onto which the symbols are to be interleaved. The control unit 224 also outputs control signals 113 to the lookup table 105 shown in FIGS. 3, 5 and 6 in order to retrieve the current number of carriers $N_{bwx}(n)$ from the lookup table 105.

As shown in FIGS. 5 and 6 the same control unit 224 is shown correspondingly the same address check circuit 216 and toggle unit 218 is shown. As will be appreciated therefore because the input interleaver can operate in different modes, then in each of the modes only the feed back shift register and permutation codes need change so that the same control unit can control the interleaver memory in each of the different modes.

FIG. 6 provides an example of an address generator for the 32 k mode, which corresponds to the address generator shown in FIG. 5, where like parts have the same references. However for the 32K mode, the linear feed back shift register is formed by thirteen register stages 200.2 and in accordance with a generator polynomial, the content of the shift register 200.2 a next bit of the shift register is provided from the output of the xor-gate 202.2 by xoring the content of shift registers R[0], R[1], R[2], R[12] according to the generator polynomial:

32 k mode: $R'_i[13]=R'_{i-1}[0] \oplus R'_{i-1}[1; ] \oplus R'_{i-1}[2] \oplus R'_{i-1}[12]$ where i varies from 0 to $M_{max}-1$ A permutation circuit 210.2 permutes the order of the bits within the shift register 200.2 from an order $R'_i[n]$ to an order $R_i[n]$ at the output of the permutation circuit 210.2, according to the bit permutations given as follows:

| $R'_i$ bit positions | 13 | 12 | 11 | 10 | 9 | 8 | 7 | 6 | 5 | 4 | 3 | 2 | 1 | 0 |
|---|---|---|---|---|---|---|---|---|---|---|---|---|---|---|
| $R_i$ bit positions | 6 | 5 | 0 | 10 | 8 | 1 | 11 | 12 | 2 | 9 | 4 | 3 | 13 | 7 |

Bit permutation for the 32 k mode

As an example, this means that for the mode 32K, the bit number 12 of $R'_i$ is sent to bit position number 5 of $R_i$.

Fourteen bits from the output of the permutation circuit 210.2 are then fed on a connecting channel 212.2 to which is added a most significant bit via a channel 214 which is provided by a toggle circuit 218. A fifteen bit address is therefore generated on channel 212.2. The interleaver for the 32 k mode may also be used for other modes, so that the address generator 102 may also be used for the 2 k mode, 4 k mode, 8 k mode, 16 k mode and the 32 k mode, by adjusting accordingly the number of the maximum valid address.

If the generated address exceeds the predetermined maximum value then a control signal is generated by the address check unit 216 and fed via a connecting channel 220 to a control unit 224. If the generated address exceeds the predetermined maximum value then this address is rejected and a new address regenerated for the particular symbol.

Developing a Symbol Interleaver for Multiple Modes

Typically the address generator for each mode is configured to generate addresses only in the range [0 to $N_m-1$]. As DVB-T/H has only one type of symbol, the choice of mode or $N_u$ also determines $N_m$. This makes the idea of an odd-even frequency interleaver straight forward because during interleaving the range and sequence of write addresses for symbol 2n (even) is the same as the range and sequence of read addresses for symbol 2n-1 (odd). By operating in this way, the memory required to implement the odd-even interleaver can have only as many locations as the number of sub-carriers $N_m$ in each OFDM symbol instead of twice as much. Thus for the 32K mode whose interleaver address generation is illustrated in FIG. 6, the frequency interleaver memory required at the transmitter or the de-interleaver (at the receiver) only has to have 24192 locations, as opposed to twice that amount.

DVB-T2 incorporates 1 k, 2 k, 4 k, 8 k, 16 k and 32 k fast Fourier transform (FFT) sizes or modes for which $N_u$ is 1024, 2048, 4096, 8192, 16384, 32768 respectively. The DVB-T2 physical layer is organised in so-called physical layer frames each of which is composed of a number of symbols. Each frame starts with a preamble (P1) symbol followed by one or more secondary preamble (P2) symbols. A number of data carrying (Pd) symbols then follow before the frame is optionally closed with a frame closing (FC) symbol. Whilst P1 symbols do not carry payload data and so do not need to be frequency interleaved, the remaining types of symbols do carry payload data and so need interleaving. For a given symbol, the number of data cells it carries depends on the choice of scattered pilot pattern, SISO/MISO, extended bandwidth and generally, the particular combination of parameters (system configuration) that has been chosen for the transmitter. However for a given configuration, the number of cells carried by any one OFDM symbol depends on the symbol type. Thus a P2 symbol typically carries fewer data cells than a Pd symbol; whilst an FC symbol carries even less data cells than a P2 symbol.

Consider the transmission of symbol 2n (even) followed by symbol 2n−1 (odd) for say a 32 k system as illustrated above. Imagine that symbol 2n −1 is a P2 symbol and symbol 2n is a Pd symbol. Then the range of write addresses for symbol 2n would exceed the range of read addresses for symbol 2n−1 since a Pd symbol has more data cell capacity than a P2 symbol. Since the addresses are generated pseudo-randomly, another consequence of the above is that sequencing of the write and read addresses also differs. This means that it is no longer a trivial task to implement the odd-even interleaving with a single memory. It is nevertheless possible to implement it using two separate memories: each of size $N_{max}$ locations where $N_{max}$ is the maximum number of data cells that can be carried by any type of symbol in bandwidth extension mode, but this would require twice the memory $2 N_{max}$. Note that $N_{max}$ depends on the chosen FFT size or OFDM mode.

As will be explained shortly, the present invention provides an arrangement by which the frequency interleaving can still be implemented using only one memory of size $N_{max}$ locations.

Optimal Use of Odd Interleavers

As shown in FIG. 4, two symbol interleaving processes, one for even symbols and one for odd symbols allows the amount of memory used during interleaving to be reduced. In the example shown in FIG. 4, the write in order for the odd symbol is the same as the read out order for the even symbol therefore while an odd symbol is being read from the memory, an even symbol can be written to the location just read from; subsequently, when that even symbol is read from the memory, the following odd symbol can be written to the location just read from.

As disclosed in co-pending UK patent application number 0722728.3, which corresponds to published application number GB2454267, it has been discovered that interleaving schemes designed for the 2 k and 8 k symbol interleavers for DVB-T and the 4 k symbol interleaver for DVB-H work better for odd symbols than even symbols. This is because the average distance at the interleaver output of sub-carriers that were adjacent at the interleaver input is greater for an interleaver for odd symbols than an interleaver for even symbols.

As will be understood, the amount of interleaver memory required to implement a symbol interleaver is dependent on the number of data symbols to be mapped onto the COFDM carrier symbols. Thus a 16 k mode symbol interleaver requires half the memory required to implement a 32 k mode symbol interleaver and similarly, the amount of memory required to implement an 8 k symbol interleaver is half that required to implement a 16 k interleaver. Therefore for a transmitter or receiver that can implement a symbol interleaver of a given mode, that receiver or transmitter will include sufficient memory to implement two odd interleaving processes for a mode half or smaller than that given mode. For example a receiver or transmitter including a 32 k interleaver will have enough memory to accommodate two 16 k odd interleaving processes each with their own 16 k memory.

Therefore, in order to address the fact that even interleaving processes appear not to perform as well as odd interleaving processes a symbol interleaver capable of accommodating multiple modulation modes can be arranged so that only an odd symbol interleaving process is used if in a mode which comprises half or less of the number of carriers in the maximum mode. For example in a transmitter/receiver capable of the 32 k mode, when operating in a mode with fewer carriers (i.e. 16 k, 8 k, 4 k or 1 k) then rather than employing separate odd and even symbol interleaving processes, two odd interleavers would be used. As disclosed in UK patent application number 0722728.3, which corresponds to published application number GB2454267, the performance of an interleaver, which uses two odd interleavers could be further improved by using a sequence of odd only interleavers rather than a single odd only interleaver, so that any bit of data input to the interleave does not always modulate the same carrier in the OFDM symbol. This can be achieved by either adding an offset to the interleaver address modulo the number of data carriers, or using a sequence of permutations in the interleaver. Adding an offset to the interleaver address modulo the number of data carriers effectively shifts and wraps-round the OFDM symbol so that any bit of data input to the interleaver does not always modulate the same carrier in the OFDM symbol.

Furthermore, the offset may be a random sequence, which may be generated by another address generator from a similar OFDM symbol interleaver or may be generated by some other means. In addition to the above, co-pending UK patent application 0722728.3, which corresponds to published application number GB2454267, discloses use of a sequence of permutations in the interleaver to increase a likelihood that any bit of data input to the interleaver does not always modulate the same carrier in the OFDM symbol.

As explained above, in DVB-T2, there are two forms in which the frequency interleaver operate. The choice of form is decided by the choice of FFT size or mode of the OFDM. Thus in modes 1 k, 2 k, 4 k, 8 k and 16 k the frequency interleaver can operate in its odd-only form whilst in mode 32 k, it operates in odd-even form as described above. In the odd-only form, the interleaver equations can be modified as follows:

$$y_q = x_{H_0(q)} \text{ for even symbols for } q=0, \ldots, N_m-1$$

$$y_q = x_{H_1(q)} \text{ for odd symbols for } q=0, \ldots, N_m-1$$

where $H_0(q)$ is the pseudo-random address generated for carrier q of an even symbol and $H_1(q)$ is the pseudo-random address generated for carrier q of an odd symbol. There are in effect separate address generators for odd and even symbols. These pairs of address generator circuits for each FFT size are described in the draft DVB-T2 recommendation [2]. Whilst the odd-only interleaver conceptually requires two separate memories each of size $N_{bwx}$, locations, it is envisaged that practical implementations of DVB-T2 transmitters and/or receivers will have to support all FFT sizes. So in such implementations, there would be enough memory to implement odd-even interleaving for 32 k. Such memory already has enough capacity to support two 16 k, four 8 k, eight 4 k, sixteen 2 k and thirty-two 1 k frequency interleavers. As a result, the odd-only interleaving does not require additional memory, because the large memory already available for the 32 k odd-even interleaving can be segmented into the two memory blocks that are needed for the smaller FFT sizes in odd-only interleaving. The present technique therefore provides a method for implementing the 32 k odd-even interleaving with minimum memory.

Minimum Memory Requirement

The present technique provides an arrangement which allows a minimum amount of memory to be used in the 32 k mode. As explained above according to the present technique for the maximum memory size operating mode which in the present example is the 32 k mode, an odd-even interleaving scheme is required with a minimum amount of memory. Furthermore, as explained above the number of data cells or sub-carriers will vary between symbols so that on a symbol by symbol basis the 32 k mode, in order to reduce the amount of memory required, the present technique allows only a single memory to be used to interleave symbols for the maximum 32 k mode where the range of right addresses and read addresses changes for successive odd and in even symbols.

Figure 7:
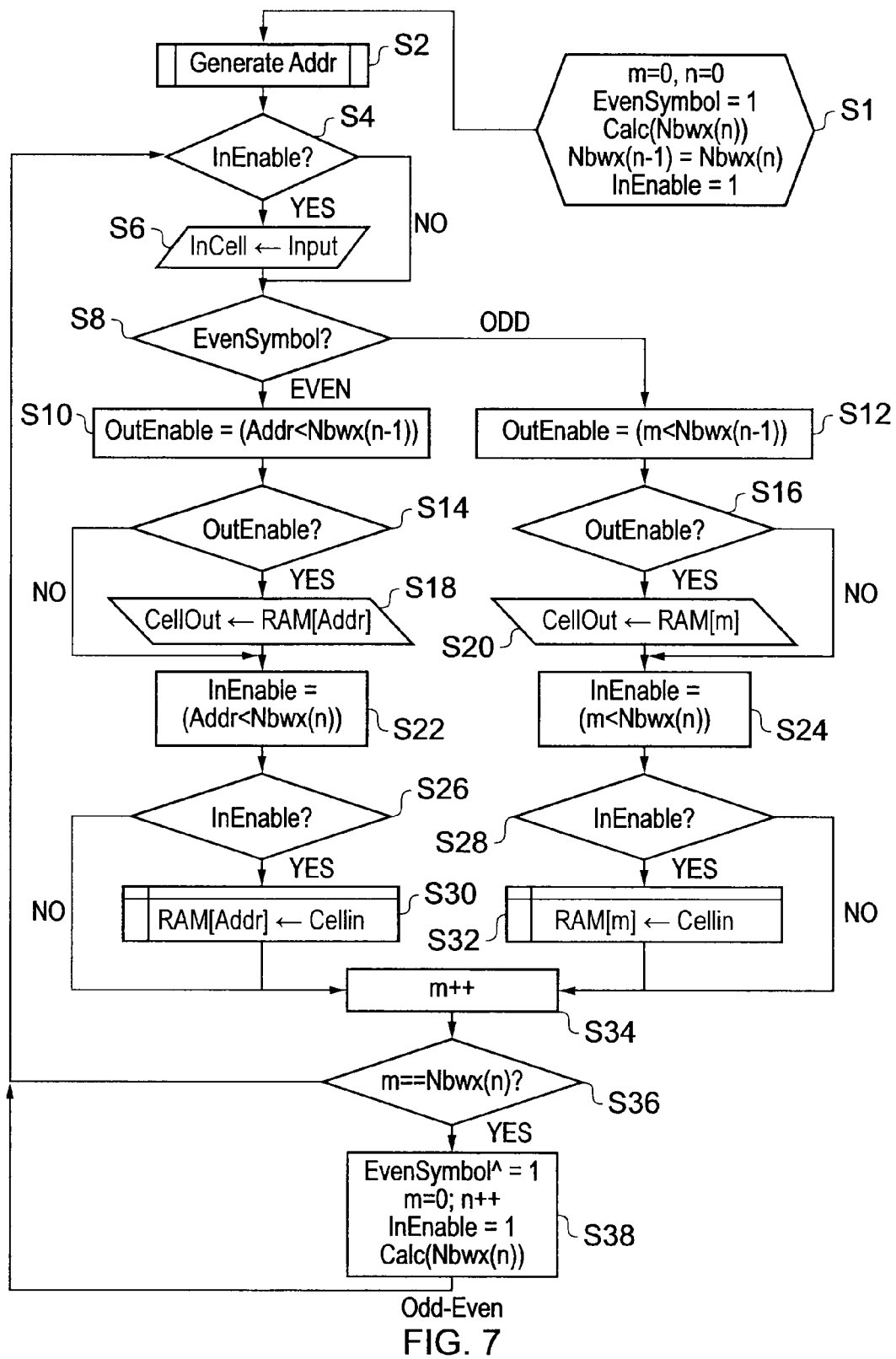
FIG. 7 is a flow diagram illustrating the operation of the interleaver shown in FIG. 3 in odd-even mode, for example for the 32K model.

An example of the present technique is illustrated in the flow diagram shown in FIG. 7 which illustrates the operation of the control unit 224 for the odd/even mode of operation for the maximum memory size available which in the present example is the 32 k mode. The 32 k odd-even frequency interleaver illustrated in the flow chart of FIG. 7, uses the following nomenclature:

$N_{bwx}(n)$ represents the number of data carriers in the symbol n

Addr is the pseudo-random address generated by the equivalent of FIG. 1 for 32 k Input is the data cell input to the frequency interleaver and stored in InCell.

CellOut is the data cell output from the frequency interleaver.

RAM is the $N_{max}$, location frequency interleaver memory where $N_{max}$ is the maximum number of data cells across all symbol types including extended bandwidth i.e. $N_{max} = \max(N_{bwx})$.

m is the counter for the data cells per OFDM symbol.

The function $\text{Calc}(N_{bwx}(n))$ is a table look-up: given the symbol number n within a DVB-T2 physical layer frame, the type of symbol n can be determined in conjunction with other system configuration parameters. Once the type of symbol is known, $N_{bwx}$ can be looked-up from the appropriate table in the DVB-T2 specification [2].

According to the present technique, as illustrated by FIG. 7, data cells are read from the input only when the generated address is valid for the current symbol otherwise, the input is not read. Equivalently, data cells are written to the output of the interleaver only when the generated address is valid for the previous symbol. The operation of the control unit 224 as represented by the flow diagram shown in FIG. 7 will now be explained:

At step S1 the variables represented in the flow diagram are initialized. Thus the counter for the number of data cells per OFDM Symbol m is initialized (m=0), the count of the symbol n is initialized (n=0), the even symbol flag is initialized to be true (Even=1), and the number of carriers for symbol n ($N_{bwx}(n)$) and symbol n−1 ($N_{bwx}(n-1)$) are initialised to be equal to each other and the In-enable flag is set to 1 (true).

S2: At step S2 an address is generated by the address generator from the output of the address bus 212.2 and read from the address check circuit 216 into the control unit 220.

S4: At a decision point S4 the In-enable flag is checked and if true a data cell is input to the frequency interleaver and stored a buffer Incell in step S6. If false then processing proceeds to step S8.

S8: If at step S8 the even symbol flag is set to be true, that is the present symbol is the even symbol, then the out-enable flag is set in accordance with whether the generated address is less than the total number of data carriers in the (n−1)-th OFDM symbol at step S10, which is the previous OFDM symbol by accessing the look-up table 105 using the function $N_{bwx}(n-1)$. If the symbol is odd then processing proceeds at step S12 and the output flag is set in accordance with whether the current counter for the data cell for the OFDM symbol is less than the total number of carriers available for the previous OFDM symbol (n−1) using the function $N_{bwx}(n-1)$ as for the even symbol.

S14, S16: The output enable flag (out-enable) is tested to determine whether it is true or false, and then branches for the odd and even symbol. If the output enable flag is true (yes) then processing proceeds to steps S18 and step S20 for the even and odd symbols respectively.

S18: If the output enable flag from step S14 is true then the data symbol is read out from the memory at the generated address and output from the interleaver memory (cell out).

S20: If the output enable flag from a step S16 is true then the data symbol at the memory address for the counter m for the present symbol is output from the interleaver (cell out).

If the output enable flags from decision points S14 and S16 are false then processing proceeds for the even and odd symbols from steps S22 and S24.

S22: The in-enable flag is set at step S22 in accordance with whether the generated address (at step S2) is less than the number of data symbols available in the current symbol as determined from the look-up table function $N_{bwx}(n)$.

S24: The in enable flag is set in accordance with whether the current count m of data symbols for the OFDM symbol is less than the total number of carriers for the current OFDM symbol $N_{bwx}(n)$.

Processing then proceeds for the even and odd branches respectively at decision steps S26 and S28.

S26: If the in-enable flag is set to be true then the received cell (Incell) is written into the interleaver memory, in step S30, at the address generated by the address generator at step S2.

S28: If the input enable flag is true then the received data cell is written into the memory, in step S32, at the address indicated by the current counter for the data cells m.

If the in-enable flags are false at decision steps S26 and S28 then processing proceeds to step S34 where the counter m is incremented. Processing then proceeds to step S36.

S36: At decision point S36 the number of the current count of data cells for the current OFDM symbol is tested to determine whether it is currently equal to the maximum number of data cells which can be carried (number of sub-carriers) in the current OFDM symbol. If it is true then processing proceeds to step S38. If false then processing loops around back to step S2 where the next address is generated for the address generator circuits as shown in FIG. 5.

S38: If the counter m for the number of sub-carriers for the current OFDM symbol has been reached, as determined at step S36, then the even symbol flag is toggled, the counter of the number of data symbols for the current OFDM Symbol is re-set to zero (m=0) and the number of symbols is incremented. Also the in-enable flag is set to be true and the lookup table is used to retrieve the number of data cells which can be mapped onto the current OFDM symbol from the lookup table 105.

Figure 8:
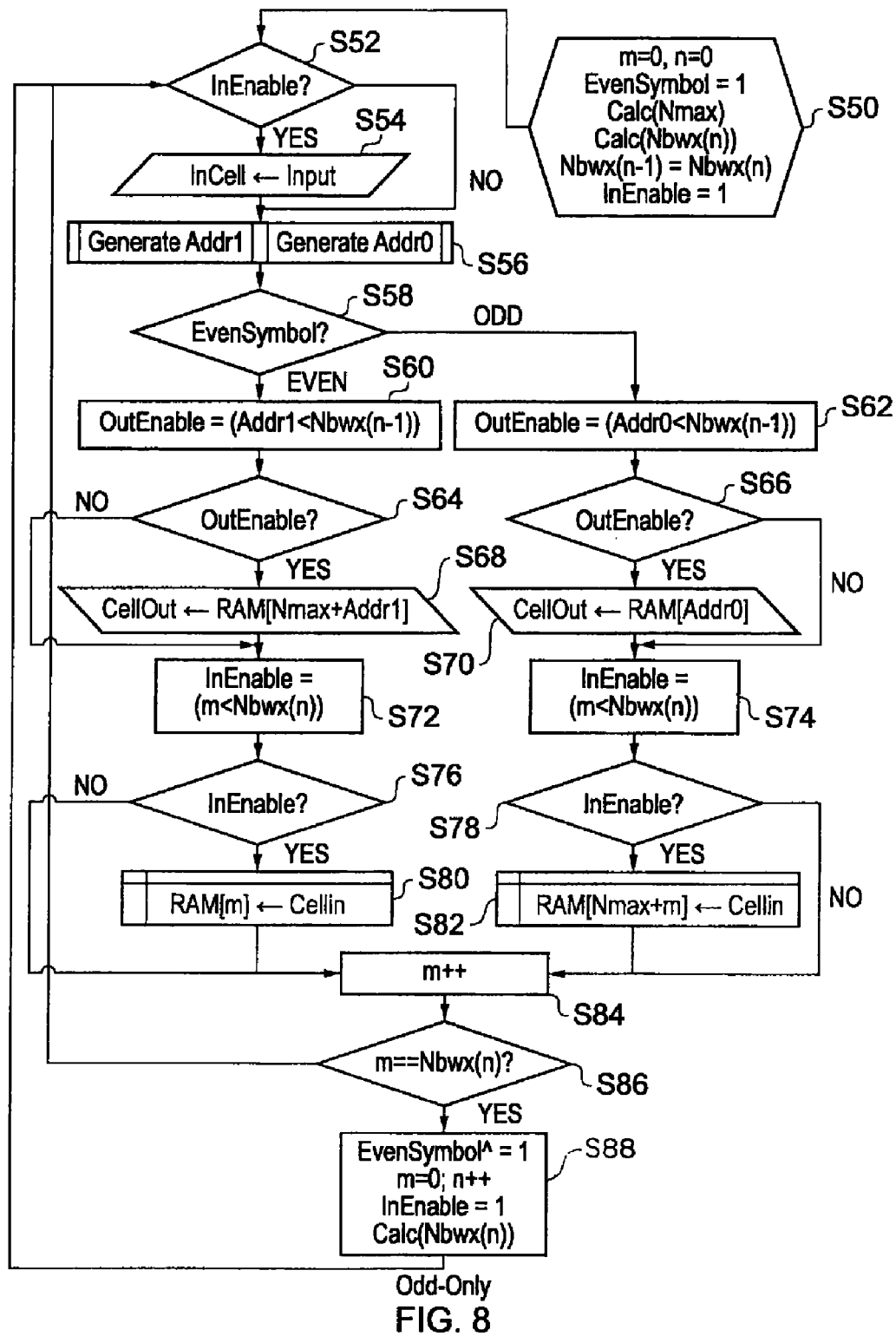
FIG. 8 is a flow diagram illustrating the operation of the interleaver shown in FIG. 3 in odd only mode, for example for the 16K model.

The method of implementation of the odd-only frequency interleaver for other FFT sizes other than 32K is illustrated in the flow diagram of FIG. 8. In addition to the variables defined for the odd-even case above we also have:

Addr0 this is the pseudo-random addresses $H_0(q)$.

Addr1 this is the pseudo-random addresses $H_1(q)[2]$.

Reading and writing of data cells from the interleaver input and to the output respectively, are also gated by the validity of the generated addresses. The data cells read into the interleaver memory are stored as follows: data cells from even symbols are stored in locations 0 to $N_{max}-1$ while data cells from odd symbols are stored in locations $N_{max}$ to $2 N_{max}-1$.

The flow diagram shown in FIG. 8 is summarised as follows:

S50: At step S50, variables for the process are initialized so that the counter of the current data symbols m for the current OFDM cell is initialised to zero (m=0) and the current count of OFDM symbols is n is initialised as zero (n=0). The even symbol flag is set to 1 (true) and the maximum number of generated addresses is determined for the current mode of operation $Calc(N_{bwx}(n))$, by retrieving this value from the lookup table 105. The maximum number of data cells which can be mapped onto the previous OFDM symbol (n−1) is set equal to the maximum number for the current OFDM symbol. The input enable flag is also set to be true.

S52: At decision point S52 the input enable flag is tested to determine whether it is currently true. If it is true then processing proceeds to step S54 and the current data symbol is input and stored in the variable buffer "in-cell". If it is not true then processing proceeds to step S56.

S56: At step S56 addresses are generated by the address generator circuit, such as that for FIG. 6, depending on whether the current symbol is an even OFDM symbol or an odd OFDM symbol (Addr1, Addr0 respectively).

S58: At decision point S58 it is determined whether the current OFDM symbol is an odd symbol or an even symbol. If the current symbol is an even symbol then processing proceeds to step S60 whereas if it is an odd symbol then processing proceeds with step S62.

S60: The output enable flag is set to true or false depending on whether the even address (Addr1) is less than the maximum number of carriers available for the previous OFDM symbol $N_{bwx}(n-1)$.

S62: If the current symbol is an odd symbol then the output enable flag is set to be true or false in accordance with whether the odd generated address (Addr0) is less than the maximum number of sub-carriers available in the previous OFDM symbol $N_{bwx}(n-1)$.

Processing then proceeds for the even and odd branches respectively with decision points S64 and S66.

At decision point S64 it is determined whether the output enable flag is true. If it is true then processing proceeds to step S68 and the data symbol is retrieved from the interleaver memory at position $N_{max}$ plus the even generated address (Addr1) and stored in the output cell buffer (CellOut) for outputting from the interleaver.

S70: If the output enable flag is true for the odd OFDM symbol then the data symbol is retrieved at the odd generated address (Addr0) and stored in the cell-out data buffer (CellOut) for outputting from the interleaver.

If the decision points at S64 and S66 are both false that is the output is not enabled then processing proceeds to steps S72, S74 for the even and odd branches respectively.

S72: At step S72 the input enable flag is set to be true or false in accordance with whether or not the current count of data symbols for the current OFDM Symbol is less than the maximum number of data symbols which can be carried by the current OFDM symbol $N_{bwx}(n)$.

S74: For the corresponding operation on the odd OFDM symbol branch the input in-enable flag is set to be true or false in accordance with whether or not the current count of the data symbols m for the current OFDM symbol n is less than the number of data symbols available for the current OFDM symbol $N_{bwx}(n)$, which provides a corresponding operation to that done is step S72.

Processing then proceeds for the odd and even OFDM symbol branches with a decision point at step S76, S78.

S76: At decision point S76 the input enable flag Inenable is analyzed and if it is true then the data symbol in the input cell buffer (InCell) is written into the interleaver memory at a memory address identified by the counter n in the process step S80.

S78: For the corresponding operation for the odd OFDM symbol the received data symbol in the input buffer (InCell) is written into the interleaver memory at address $N_{max}+n$ in process step S82.

Otherwise from decision points S76 and S78 the counter for the number of data symbols for OFDM symbol is incremented at step S84 and processing passes to decision step S86.

S86: At decision point S86 it is determined whether the counter for the current number of data symbols received for the current OFDM symbol is equal to the maximum number of symbols which can be mapped onto the current OFDM symbol as retrieved from the lookup table 105 $N_{bwx}(n)$. If the maximum number of data symbols has already been mapped onto the current OFDM symbol, then processing passes to step S88. Otherwise processing passes back to step S52.

S88: If the current OFDM symbol has reached its maximum number of data symbols, which it can carry, then the even symbol flag is toggled, the number OFDM symbols is incremented, the counter for the number of data symbols for the current OFDM symbol is reset to zero (m=0) and the input enable flag is set to be true. The lookup table 105 is then interrogated for the maximum number of data symbols which can be mapped onto the subsequent OFDM symbol n, $N_{bwx}(n)$.

Receiver

Figure 9:
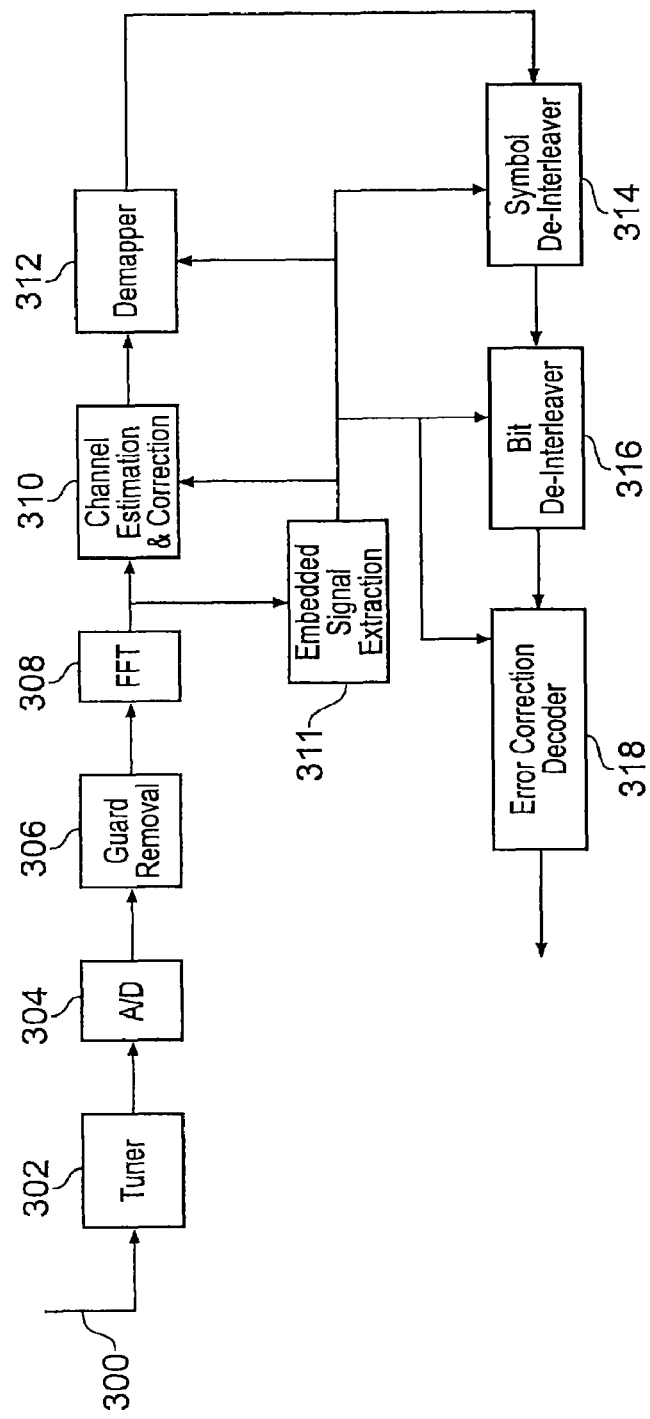
FIG. 9 is a schematic block diagram of a Coded OFDM receiver which may be used, for example, with the DVB-T2 standard.

FIG. 9 provides an example illustration of a receiver which may be used with the present technique. As shown in FIG. 9, a COFDM signal is received by an antenna 300 and detected by a tuner 302 and converted into a digital form by an analogue-to-digital converter 304. A guard interval removal processor 306 removes the guard interval from a received COFDM symbol, before the data is recovered from the COFDM symbol using a Fast Fourier Transform (FFT) processor 308 in combination with a channel estimator and correction 310 in co-operation with a embedded-signalling decoding unit 311, in accordance with known techniques. The demodulated data is recovered from a mapper 312 and fed to a symbol de-interleaver 314, which operates to effect the reverse mapping of the received data symbol to re-generate an output data stream with the data de-interleaved.

Figure 10:
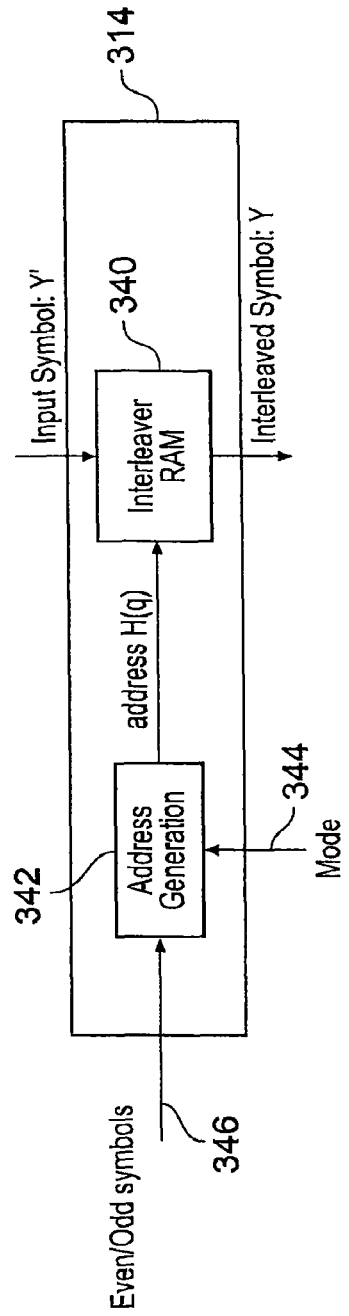
FIG. 10 is a schematic block diagram of a symbol de-interleaver which appears in FIG. 9.

The symbol de-interleaver 314 is formed from a data processing apparatus as shown in FIG. 10 with an interleaver memory 340 and an address generator 342. The interleaver memory is as shown in FIG. 4 and operates as already explained above to effect de-interleaving by utilising sets of addresses generated by the address generator 342. The address generator 342 is formed as shown in FIGS. 5 and 6 and is arranged to generate corresponding addresses to map the data symbols recovered from each COFDM sub-carrier signals into an output data stream.

The remaining parts of the COFDM receiver shown in FIG. 9, including Bit De-Interleaver 316, are provided to effect error correction decoding 318 to correct errors and recover an estimate of the source data.

One advantage provided by the present technique for both the receiver and the transmitter is that a symbol interleaver and a symbol de-interleaver operating in the receivers and transmitters can be switched between the 1 k, 2 k, 4 k, 8 k, 16 k and the 32 k mode by changing the generator polynomials and the permutation order. Hence the address generator 342 shown in FIG. 10 includes an input 344, providing an indication of the mode as well as an input 346 indicating whether there are odd/even COFDM symbols. A flexible implementation is thereby provided because a symbol interleaver and de-interleaver can be formed as shown in FIGS. 3 and 4, with an address generator as illustrated in either of FIG. 5 or 6. The address generator can therefore be adapted to the different modes by changing to the generator polynomials and the permutation orders indicated for each of the modes. For example, this can be effected using a software change. Alternatively, in other embodiments, an embedded signal indicating the mode of the DVB-T2 transmission can be detected in the receiver in the embedded-signalling processing unit (controller) 311 and used to configure automatically the symbol de-interleaver in accordance with the detected mode.

Examples of address generators, and corresponding interleavers, for the 2 k, 4 k and 8 k modes are disclosed in European patent application number 04251667.4, which corresponds to U.S. Patent Application Publication No. 2008/0298487, the contents of which are incorporated herein be reference. An address generator for the 0.5 k mode are disclosed in our co-pending UK patent application number 0722553.5, which corresponds to UK published application number GB 2454722.

Various modifications may be made to the embodiments described above without departing from the scope of the present invention. In particular, the example representation of the generator polynomial and the permutation order which have been used to represent aspects of the invention are not intended to be limiting and extend to equivalent forms of the generator polynomial and the permutation order.

As will be appreciated the transmitter and receiver shown in FIGS. 1 and 9 respectively are provided as illustrations only and are not intended to be limiting. For example, it will be appreciated that the position of the symbol interleaver and the de-interleaver with respect, for example to the bit interleaver and the mapper and mapper can be changed. As will be appreciated the effect of the interleaver and de-interleaver is un-changed by its relative position, although the interleaver may be interleaving I/Q symbols instead of v-bit vectors. A corresponding change may be made in the receiver. Accordingly the interleaver and de-interleaver may be operating on different data types, and may be positioned differently to the position described in the example embodiments.

As explained above the permutation codes and generator polynomial of the interleaver, which has been described with reference to an implementation of a particular mode, can equally be applied to other modes, by changing the predetermined maximum allowed address in accordance with the number of carriers for that mode.

As mentioned above, embodiments of the present invention find application with DVB standards such as DVB-T and DVB-H, which are incorporated herein by reference. For example embodiments of the present invention may be used in a transmitter or receiver operating in accordance with the DVB-H standard, in hand-held mobile terminals. The mobile terminals may be integrated with mobile telephones (whether second, third or higher generation) or Personal Digital Assistants or Tablet PCs for example. Such mobile terminals may be capable of receiving DVB-H or DVB-T compatible signals inside buildings or on the move in for example cars or trains, even at high speeds. The mobile terminals may be, for example, powered by batteries, mains electricity or low voltage DC supply or powered from a car battery. Services that may be provided by DVB-H may include voice, messaging, internet browsing, radio, still and/or moving video images, television services, interactive services, video or near-video on demand and option. The services might operate in combination with one another. It will be appreciated that the present invention is not limited to application with DVB and may be extended to other standards for transmission or reception, both fixed and mobile.

References

[1]. ETSI, "Digital Video Broadcasting (DVB) Framing structure, channel coding and modulation for digital terrestrial television EN300 744 v 1.1.2", August 1997.
[2]. DVB, "Digital Video Broadcasting (DVB) Frame structure, channel coding and modulation for a second generation digital terrestrial television broadcasting system (DVB-T2); Draft of EN302 755 v 1.1.1", May 2008.

The invention claimed is:

1. A data processing apparatus configured to map data symbols received from a predetermined number of sub-carrier signals of Orthogonal Frequency Division Multiplexed (OFDM) symbols into an output data stream, the predetermined number of sub-carrier signals being determined in accordance with one of a plurality of operating modes and the data symbols including first sets of data symbols and second sets of data symbols, the data processing apparatus comprising:

an address generator, a controller, and a de-interleaver memory, the controller being configured, when operating in accordance with an even de-interleaving process
to read out from the de-interleaver memory a first set of the data symbols into the output data stream using addresses generated by the address generator,
to write into the de-interleaver memory a second set of the data symbols received from the sub-carrier signals of an even OFDM symbol in accordance with a sequential order of addresses, and the controller is configured in accordance with an odd de-interleaving process,
to read out from the de-interleaver memory a first set of the data symbols into the output data stream using read addresses determined in accordance with a sequential order, and
to write into the de-interleaver memory a second set of the data symbols received from the sub-carrier signals of an odd OFDM symbol at addresses generated by the address generator, such that while data symbols from the first set are being read from locations in the de-interleaver memory, data symbols from the second set can be written to the locations just read from, wherein
the number of the sub-carriers that are available from a previous odd or even OFDM symbol is different from the number of the sub-carriers that are available from a current OFDM symbol, and the controller is configured
to determine before reading out the first data symbols from the de-interleaver memory, whether the read address is valid for the previous OFDM symbol, and
to determine before writing the second data symbols into the de-interleaver memory, whether the write address is valid for the current OFDM symbol.

2. The data processing apparatus as claimed in claim 1, wherein a minimum size of the de-interleaver memory can be provided in accordance with the maximum number of sub-carriers that are available to carry the input data symbols in any of the operating modes.

3. The data processing apparatus as claimed in claim 1, wherein the controller is configured:

to determine before reading out the first data symbols from the de-interleaver memory, whether the read address is valid, by comparing the read address with the maximum number of sub-carriers that are available for the previous OFDM symbol, and when the read address is greater than the maximum number of sub-carriers that are available, determining that the read address is not valid and not reading an data symbol from the de-interleaver memory at the read address, and to determine before writing the second input data symbols into the de-interleaver memory, whether the write address is valid, by comparing the read address with the maximum number of sub-carriers that are available for the current OFDM symbol, and when the write address is greater than the maximum number of sub-carriers that are available, determining that the write address is not valid and not writing an input data symbol to the de-interleaver memory at the write address.

4. A method of mapping data symbols received from a predetermined number of sub-carrier signals of Orthogonal Frequency Division Multiplexed (OFDM) symbols into an output data stream, the predetermined number of sub-carrier signals being determined in accordance with one of a plurality of operating modes and the data symbols including first sets of data symbols and second sets of input data symbols, the method comprising:

de-interleaving the data symbols into the output symbol stream in accordance with an even de-interleaving process by reading out from the de-interleaver memory a first set of the data symbols into the output data stream using addresses generated by the address generator, and writing into the de-interleaver memory a second set of the data symbols received from the sub-carrier signals of an even OFDM symbol using addresses determined in accordance with a sequential order, and de-interleaving the data symbols into the output symbol stream in accordance with an odd de-interleaving process by reading out from the de-interleaver memory a first set of the data symbols into the output data stream using addresses determined in accordance with the sequential order, and writing into the de-interleaver memory a second set of the data symbols received from the sub-carrier signals of an odd OFDM symbol using addresses generated by the address generator, such that while data symbols from the first set are being read from locations in the de-interleaver memory, data symbols from the second set can be written to the locations just read from, wherein the number of the sub-carriers which are available from a previous odd or even OFDM symbol is different from the number of the sub-carriers that are available from a current odd or even OFDM symbol, and the reading the data symbols out of the de-interleaver memory includes determining before reading out the first data symbols from the de-interleaver memory, whether the read address is valid for the previous OFDM symbol, and the writing the data symbols into the de-interleaver memory includes determining before writing the second data symbols into the de-interleaver memory, whether the write address is valid for the current OFDM symbol.

5. The method of mapping as claimed in claim 4, wherein a minimum size of the de-interleaver memory can be provided in accordance with the maximum number of sub-carriers which are available to carry the input data symbols in any of the operating modes.

6. The method of mapping as claimed in claim 4, wherein the step of determining before reading out the first data symbols from the de-interleaver memory, whether the read address is valid for the previous data symbol, comprises:

comparing the read address with the maximum number of sub-carriers that are available for the previous OFDM symbol, and when the read address is greater than the maximum number of sub-carriers that are available, determining that the read address is not valid and not reading an data symbol from the de-interleaver memory at the read address, and the step of determining before writing the second data symbols into the de-interleaver memory, whether the write address is valid for the current OFDM symbol, comprises:

comparing the read address with the maximum number of sub-carriers that are available for the current OFDM symbol, and when the write address is greater than the maximum number of sub-carriers that are available, determining that the write address is not valid and not writing an input data symbol to the de-interleaver memory at the write address.

7. A receiver including the data processing apparatus according to claim 1.

* * * * *